(12) United States Patent
Morrissey et al.

(10) Patent No.: US 6,531,046 B2
(45) Date of Patent: Mar. 11, 2003

(54) SEED LAYER REPAIR METHOD

(75) Inventors: Denis Morrissey, Huntington, NY (US); David Merricks, Boston, MA (US); Leon R. Barstad, Raynham, MA (US); Eugene N. Step, Newton, MA (US); Jeffrey M. Calvert, Acton, MA (US); Robert A. Schetty, III, Fort Salonga, NY (US); James G. Shelnut, Northoboro, MA (US); Mark Lefebvre, Hudson, NH (US); Martin W. Bayes, Hopkinton, MA (US); Donald E. Storjohann, Watertown, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 09/738,551

(22) Filed: Dec. 15, 2000

(65) Prior Publication Data

US 2002/0000382 A1 Jan. 3, 2002

Related U.S. Application Data
(60) Provisional application No. 60/170,998, filed on Dec. 15, 1999.

(51) Int. Cl.$^7$ .................................................. C25D 5/34
(52) U.S. Cl. ........................................ 205/219; 205/296
(58) Field of Search ................................ 205/296, 291, 205/205, 219

(56) References Cited

U.S. PATENT DOCUMENTS

| | | | | |
|---|---|---|---|---|
| 5,004,525 A | * | 4/1991 | Bernards et al. | ............ 205/239 |
| 5,824,599 A | | 10/1998 | Schacham-Diamond et al. | 438/678 |
| 6,277,263 B1 | * | 8/2001 | Chen | ............ 205/170 |

FOREIGN PATENT DOCUMENTS

| | | |
|---|---|---|
| EP | 1 005 078 | 5/2000 |
| WO | WO 99/47731 | 9/1999 |

* cited by examiner

*Primary Examiner*—Nam Nguyen
*Assistant Examiner*—Thomas H. Parsons
(74) *Attorney, Agent, or Firm*—S. Matthew Cairns

(57) ABSTRACT

Disclosed are methods of repairing metal seed layers prior to subsequent metallization. Such repair methods provide metal seed layers disposed on a substrate that are substantially free of metal oxide and substantially free of discontinuities.

20 Claims, 2 Drawing Sheets

SEED LAYER REPAIR METHOD

CROSS-REFERENCES TO RELATED APPLICATIONS

This Application claims the benefit of U.S. Provisional Application No. 60/170,998, filed Dec. 15, 1999.

BACKGROUND OF THE INVENTION

1. Field of the Invention

This invention relates generally to the field of seed layers for subsequent metallization. In particular, this invention relates to methods for repairing seed layers prior to metallization.

2. Description of the Related Art

The trend toward smaller microelectronic devices, such as those with sub-micron geometries, has resulted in devices with multiple metallization layers to handle the higher densities. One common metal used for forming metal lines, also referred to as wiring, on a semiconductor wafer is aluminum. Aluminum has the advantage of being relatively inexpensive, having low resistivity, and being relatively easy to etch. Aluminum has also been used to form interconnections in vias to connect the different metal layers. However, as the size of via/contact holes shrinks to the sub-micron region, a step coverage problem appears which in turn can cause reliability problems when using aluminum to form the interconnections between the different metal layers. Such poor step coverage results in high current density and enhances electromigration.

One approach to providing improved interconnection paths in the vias is to form completely filled plugs by using metals such as tungsten while using aluminum for the metal layers. However, tungsten processes are expensive and complicated, tungsten has high resistivity, and tungsten plugs are susceptible to voids and form poor interfaces with the wiring layers.

Copper has been proposed as a replacement material for interconnect metallizations. Copper has the advantages of improved electrical properties as compared to tungsten and better electromigration property and lower resistivity than aluminum. The drawbacks to copper are that it is more difficult to etch as compared to aluminum and tungsten and it has a tendency to migrate into the dielectric layer, such as silicon dioxide. To prevent such migration, a barrier layer, such as titanium nitride, tantalum nitride and the like, must be used prior to the depositing of a copper layer.

Typical techniques for applying a copper layer, such as electrochemical deposition, are only suitable for applying copper to an electrically conductive layer. Thus, an underlying conductive seed layer, typically a metal seed layer such as copper, is generally applied to the substrate prior to electrochemically depositing copper. Such seed layers may be applied by a variety of methods, such as physical vapor deposition ("PVD") and chemical vapor deposition ("CVD"). Typically, seed layers are thin in comparison to other metal layers, such as from 50 to 1500 angstroms thick. Such metal seed layers, particularly copper seed layers, may suffer from problems such as metal oxide both on the surface of the seed layer and in the bulk of the layer as well as discontinuities in the layer.

Oxide on a metal seed layer, particularly a copper seed layer, interferes with subsequent copper deposition. Such oxide forms from exposure of the metal seed layer to oxygen, such as air. The longer such seed layer is exposed to oxygen, the greater the amount of oxide formation. Where a copper seed layer is thin, the copper oxide may exist as copper oxide throughout the layer. In other areas of electroplating, such as in electronics finishing, copper oxide layers are typically removed by acidic etching baths. These baths dissolve the oxide layer, leaving a copper metal surface. Such etching processes are not generally applicable to copper seed layers because of the thinness of the seed layer. As the oxide is removed from the seed layer surface there is the danger that the entire seed layer may be removed in places, creating discontinuities in the seed layer.

U.S. Pat. No. 5,824,599 (Schacham-Diamand et al.) discloses a method of preventing oxide formation on the surface of a copper seed layer by conformally blanket depositing under vacuum a catalytic copper layer over a barrier layer on a wafer and then, without breaking the vacuum, depositing a protective aluminum layer over the catalytic copper layer. The wafer is then subjected to an electroless copper deposition solution which removes the protective aluminum layer exposing the underlying catalytic copper layer and then electrolessly deposits copper thereon. However, such method requires the use of a second metal, aluminum, which adds to the cost of the process and the presence of any unremoved protective layer prior to the electroless deposition of the copper may cause problems in the final product, such as an increase in resistivity. In addition, the dissolved aluminum may build up in the electroless copper bath, which could also cause problems in the final product.

Discontinuities or voids are areas in the seed layer where coverage of the metal, such as copper, is incomplete or lacking. Such discontinuities can arise from insufficient blanket deposition of the metal layer, such as depositing the metal in a line of sight fashion. In order for a complete metal layer to be electrochemically deposited on such a seed layer, the discontinuities must be filled in prior to or during the deposition of the final metal layer, or else voids in the final metal layer may occur.

PCT patent application number WO 99/47731 (Chen) discloses a method of providing a seed layer by first vapor depositing an ultra-thin seed layer followed by electro-chemically enhancing the ultra-thin seed layer to form a final seed layer. According to this patent application, such a two step process provides a seed layer having reduced discontinuities. The copper seed layer is enhanced by using an alkaline electrolytic bath. Acid electrolytic baths for the seed layer enhancement are disclosed to be problematic due to the fact that voids in the seed layer can be created and thus providing poor uniformity in the metal layer deposited thereon. One using this method to enhance a seed layer would have to rinse and neutralize the seed layer before using conventional acidic electrolytic plating baths. In addition, a manufacturer using such alkaline enhancement method in combination with an acid electroplating bath would have to double the number of plating heads on the plating tool or throughput would decrease.

Thus, there is a continuing need for methods of repairing seed layers that remove any oxide surface formed, that do not require the use of additional metals, that enhance the lateral growth of seed layers to reduce or remove discontinuities, and that are compatible with commercial metal deposition processes.

SUMMARY OF THE INVENTION

The inventors have surprisingly found that a metal oxide layer may be easily removed from a seed layer surface without the use of an etchant solution and without increasing the size and number of seed layer discontinuities. The inventors have further found a method for enhancing the lateral growth of a seed layer using an acidic electrolytic bath.

In one aspect, the present invention is directed to a method of providing a metal seed layer substantially free of metal oxide disposed on a substrate including the steps of contacting a metal seed layer disposed on a substrate with an aqueous solution having a pH maintained in the range of about 6.5 to about 13 and subjecting the solution to a voltage of from about 0.1 to 5 volts.

In a second aspect, the present invention is directed to a method of providing a metal seed layer substantially free of discontinuities disposed on a substrate comprising the steps of contacting a metal seed layer disposed on a substrate with an acidic electrolyte bath and subjecting the bath to a current density in the range of up to about 0.1 A/cm$^2$, wherein the acidic electrolyte bath comprises one or more acids, one or more copper compounds, one or more suppressors and water, wherein the acidic electrolyte bath is free of accelerators.

In a third aspect, the present invention provides a method of providing a metal seed layer substantially free of metal oxide and substantially free of discontinuities disposed on a substrate including the steps of contacting a metal seed layer disposed on a substrate with an aqueous solution having a pH maintained in the range of about 6.5 to about 13, subjecting the aqueous solution to a voltage of from about 0.1 to 5 volts, removing the substrate, optionally rinsing the metal seed layer disposed on the substrate, contacting the metal seed layer with an acidic electrolyte bath and subjecting the acidic electrolyte bath to a current density in the range of up to about 0.1 A/cm$^2$, wherein the acidic electrolyte bath includes one or more acids, one or more copper compounds, one or more suppressors and water, and wherein the acidic electrolyte bath is substantially free of accelerators.

In a fourth aspect, the present invention provides a plating bath composition for substantially repairing discontinuities in a metal seed layer disposed on a substrate including one or more acids, one or more copper compounds, one or more suppressors and water, wherein the bath is substantially free of accelerators.

In a fifth aspect, the present invention provides a method for providing a metallized layer disposed on a substrate including the steps of: a) optionally coating the substrate with a barrier layer; b) providing a metal seed layer on the surface of the substrate; c) repairing the metal seed layer by substantially repairing discontinuities in the metal seed layer including the step of contacting the metal seed layer with an acidic electrolyte bath and subjecting the bath to a current density in the range of up to about 0.1 A/cm$^2$, wherein the acidic electrolyte bath includes one or more acids, one or more copper compounds, one or more suppressors and water, and wherein the acidic electrolyte bath is substantially free of accelerators; d) subjecting the repaired metal seed layer to a metal plating bath to provide a metallized layer disposed on the substrate; and e) optionally rinsing the metallized layer disposed on the substrate.

In a sixth aspect, the present invention provides a substrate having a metallized layer disposed thereon according to the method described above.

DETAILED DESCRIPTION OF THE INVENTION

Figure 1:
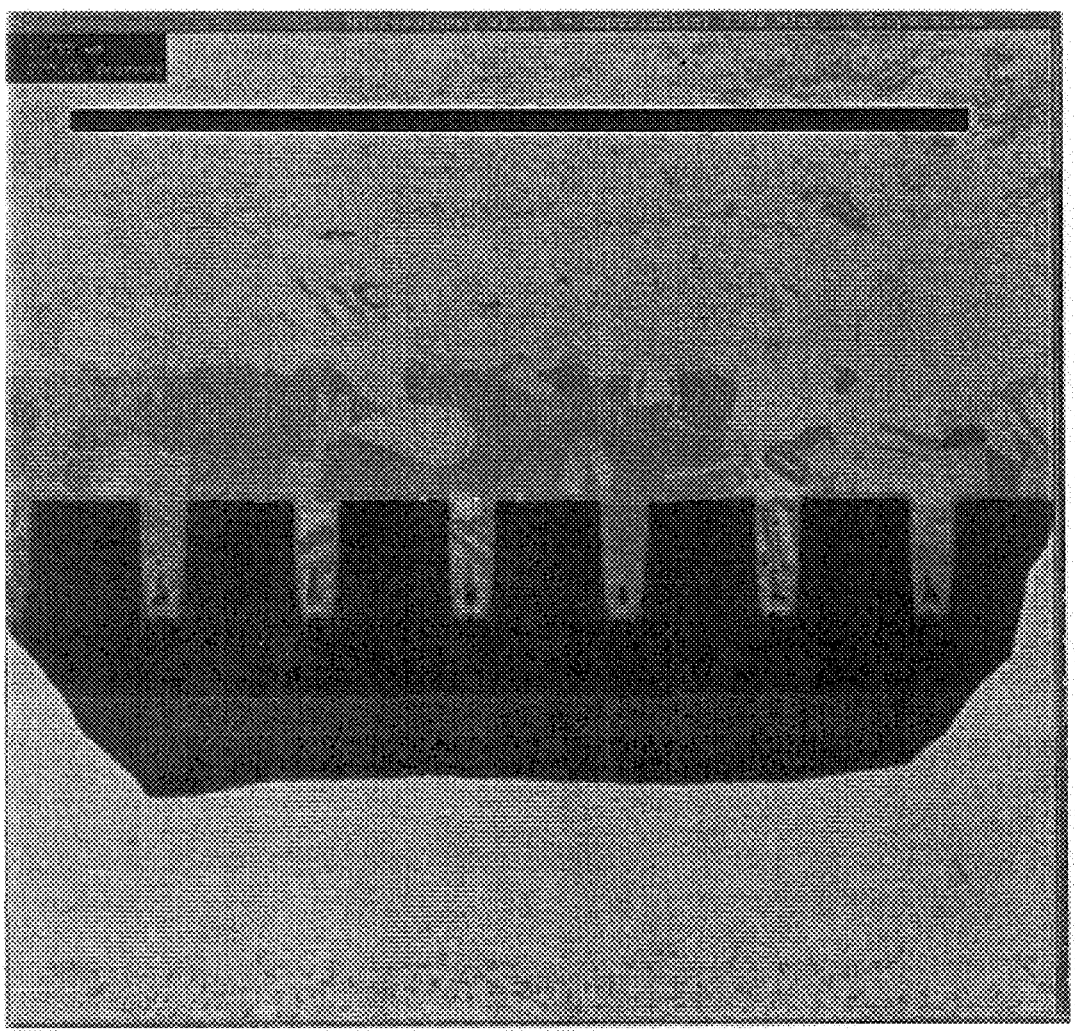
FIG. 1 is a scanning electron micrograph ("SEM") of a wafer showing 0.2 micron vias containing voids.

As used throughout this specification, the following abbreviations shall have the following meanings, unless the context clearly indicates otherwise: A/cm$^2$=amperes per square centimeter; V=volts; ° C.=degrees Centigrade; g=gram; cm=centimeter; Å=angstrom; L=liter, ppm=parts per million; g/L=grams per liter; mL=milliliter; and mL/L= milliliters per liter. The term "halide" refers to fluoride, chloride, bromide and iodide.

All amounts are percent by weight and all ratios are by weight, unless otherwise noted. All numerical ranges are inclusive.

The present invention provides a method for repairing a metal seed layer disposed on a substrate by substantially removing the oxide surface and discontinuities of the metal seed layer. Suitable substrates for metal seed layers are any which support the metal seed layer. Suitable substrates include, but are not limited to, semiconductor wafers and dielectric layers. Such wafers typically comprise silicon. Dielectric layers, particularly those used in semiconductor manufacture, typically comprises silicon dioxide, silicon carbide, silicon nitride, silicon oxynitride ("SiON"), but may also comprise siloxanes, silsesquioxanes or organic polymers, such as polyarylene ethers, benzocyclobutene, polyimides and the like.

The metal seed layers of the present invention comprise any metal that will subsequently be subjected to metallization, preferably electrolytic metallization. Suitable metal seed layers include, but are not limited to: copper, copper alloys, nickel, nickel alloys, cobalt, cobalt alloys, platinum, platinum alloys, iridium, iridium alloys, palladium, palladium alloys, rhodium, rhodium alloys and the like. It is preferred that the metal seed layer is copper or copper alloy. Such metal seed layers are typically blanket deposited on a substrate.

Any means of blanket depositing the metal seed layer on a substrate may be used. Suitable means include, but are not limited to physical vapor deposition, chemical vapor deposition, and solution deposition such as electroless metal deposition. Physical vapor deposition methods include evaporation, magnetron, and/or rf-diode sputter deposition, ion beam sputter deposition, arc-based deposition, and various plasma-based depositions such as ionized metal plasma. It is preferred that the metal seed layer is deposited by physical vapor deposition, and more preferably by ionized metal plasma deposition. Such metal seed layer deposition methods are generally well known in that art. For example, S. M. Rossnagel, Directional and Ionized Physical Vapor Deposition for Microelectronics Applications, *Journal of Vacuum Science Technology, B*, volume 16, number 5, pages 2585–2608, September/October 1998, discloses various physical vapor deposition methods and is hereby incorporated by reference to the extent this article teaches the use of such methods.

In one aspect of the present invention, metal oxide contained in the metal seed layer is reduced to the metal. The term "metal oxide contained in the metal seed layer" refers to metal oxide on the surface of the seed layer, in the bulk of the seed layer and both on the surface and in the bulk of the seed layer. Such reduction of the metal oxide in the metal seed layer is achieved without the use of etchant solutions. Etchant solutions dissolve away the metal oxide, thus providing a metal layer having reduced thickness. For thin metal layers, such as seed layers, and particularly for copper seed layers in microelectronic devices having sub-0.5 micron geometries, such dissolution of the metal oxide results in even thinner metal layers and possibly a complete dissolution of the metal layer in places, thereby creating discontinuities. Thus, the present invention provides a method of providing a metal seed layer that is substantially free of metal oxide, without dissolution of the metal oxide. By "substantially free of metal oxide" is meant a metal seed layer where only a small amount of metal oxide is present in the seed layer. It is preferred that the metal seed layer is free of metal oxide.

The metal oxide on the metal seed layer is reduced by contacting the metal seed layer disposed on a substrate with an aqueous solution having a pH maintained in the range of about 6.5 to about 13 and subjecting the aqueous solution to a voltage of from about 0.1 to 5 volts. Such reducing method is referred to herein as "cathodic activation." It is preferred that the pH of the aqueous solution is maintained in the range of about 7 to about 10, and more preferably in the range of about 7.5 to about 9. Any means for maintaining the pH of the aqueous solution is suitable for use in the present invention. Suitable means include, but are not limited to, the periodic addition of base to the aqueous solution or the use of buffers. The pH of the aqueous solution may be monitored through the use of a pH meter. Such pH monitoring can be automated and the additional base or buffer metered into the aqueous solution as needed to maintain the pH.

Any buffer that maintains a pH in the desired range is suitable for use in the present invention. Suitable buffers include, but are not limited to: phosphate, boric acid/borate, tris(hydroxymethyl)aminomethane hydrohalide salt, carbonate and the like. It is preferred that the buffer is selected from phosphate, boric acid/borate and tris(hydroxymethyl) aminomethane hydrohalide salt. The preferred tris (hydroxymethyl)aminomethane hydrohalide salt is tris (hydroxymethyl)aminomethane hydrochloride salt. The buffers are generally prepared by known methods.

The phosphate, borate and carbonate salts of the present invention may be any which are suitable for preparing buffers. Such salts typically include, but are not limited to, the alkali and alkaline earth salts, such as sodium and potassium, ammonium salts, and the like. It will be appreciated by those skilled in the art that phosphate can be used to prepare a buffer solution having a pH in the range of about 6.9 to about 12, depending upon the particular phosphate salts and amounts of such salts employed. All such phosphate buffers are suitable for use in the present invention.

A voltage in the range of about 0.1 to about 5 volts is applied to the aqueous solution to reduce the metal oxide on the surface of the metal seed layer. It is preferred that the voltage is in the range of 0.2 to 5 volts, more preferably 1 to 5 volts, and most preferably 1 to 4 volts. Voltages higher than 5 volts may be successfully employed in the present invention but are generally not needed. The voltage is generally applied to the aqueous solution for a period of time sufficient to reduce substantially all of the metal oxide to the metal. In general, the voltage is applied to the aqueous solution for 1 to 300 seconds, preferably 15 to 120 seconds, and more preferably 20 to 60 seconds. The voltage may be applied to the aqueous solution by any conventional means, such as through the use of anodes, particularly insoluble anodes, and rectifiers on plating tools. It is preferred that the voltage be applied to the aqueous solution using insoluble anodes, particularly when a copper seed layer is being reduced. Such means will be clear to those skilled in the art.

Typically, the cathodic activation method of the present invention is performed at a temperature in the range of 15° C. to 70° C., and preferably in the range of 20° C. to 60° C. It will be appreciated by those skilled in the art that temperatures outside this range may be successfully used in the present invention, however the length of time the voltage is applied may be different.

The aqueous solutions may optionally contain other components, such as surfactants, particularly nonionic surfactants. It is preferred that when such optional components are used, they are used at low levels. It is further preferred that the aqueous solution of the present invention be free of added metals, more preferably free of transition metals, such as copper, aluminum, cobalt, nickel, tantalum, indium, titanium, and the like, and most preferably free of copper.

Once any metal oxide on the metal seed layer has been reduced, the substrate is removed from the aqueous solution and rinsed, typically with deionized water. The metal seed layer can then be contacted with a plating bath to provide lateral growth of the seed layer or alternatively, a final metal layer. By "lateral growth" is meant that metal is deposited horizontally along the surface of the seed layer at a rate faster than it is deposited upward from the seed layer. Suitable plating baths include electroless and electrolytic plating baths. Such electrolytic plating baths may be acidic or alkaline. Any method of enhancing lateral growth to remove or reduce discontinuities may be used advantageously with the cathodic reduction process of the present invention. Any metal that may be deposited electrolessly or electrolytically and is compatible with the underlying seed layer may be used. It is preferred that both the metal seed layer and the final metal layer include the same metal or an alloy thereof. It is further preferred that the final metal layer is copper, and more preferably that the seed layer and final metal layer are both copper.

In a second aspect of the present invention, discontinuities in the surface of the metal seed layer are substantially removed or repaired by contacting a metal seed layer disposed on a substrate with an acidic electrolyte bath and subjecting the bath to a current density in the range of up to about 0.1 A/cm$^2$. Thus, the present invention provides a method of providing a metal seed layer substantially free of discontinuities disposed on a substrate comprising the steps of contacting a metal seed layer disposed on a substrate with an acidic electrolyte bath and subjecting the bath to a current density in the range of up to about 0.1 A/cm$^2$, wherein the acidic electrolyte bath comprises one or more acids, one or more copper compounds, one or more suppressors and water, wherein the acidic electrolyte bath is free of accelerators. Such treatment enhances the growth of the metal seed layer laterally as compared to upward growth. Such enhanced lateral growth results in the reduction or elimination of discontinuities. By "substantially free of discontinuities" or by "substantially removing discontinuities" is meant a metal seed layer where only a small number of discontinuities is present in the seed layer, typically such discontinuities total less than 1% of the surface area. It is preferred that the metal seed layer is free of discontinuities.

The acidic electrolyte baths suitable for repairing discontinuities of the present invention contain one or more acids, one or more copper compounds, one or more suppressors and water. The copper compound may be any which is soluble. Suitable copper compounds include, but are not limited to: copper sulfate, copper persulfate, copper halide, copper chlorate, copper perchlorate, copper alkanesulfonate, such as copper methanesulfonate, copper alkanol sulfonate, copper fluoroborate, cupric nitrate, copper acetate and the like. Copper sulfate is the preferred copper compound. It is preferred that the concentration of the copper compound in the baths of the present invention is higher than that used in conventional copper plating baths. The amount of copper compound in the electrolyte bath is any amount sufficient to provide a copper content typically in the range of 5 to 75 grams of copper metal per liter of bath, and preferably 15 to 60 grams per liter.

Any acid which is compatible with the copper compound may be used in the present invention. Suitable acids include, but are not limited to: sulfuric acid, acetic acid, fluoroboric acid, nitric acid, alkanesulfonic acids and arylsulfonic acids, such as methanesulfonic acid, toluenesulfonic acid and benzenesulfonic acid, and sulfamic acid. It is preferred that the acid is sulfuric acid, alkanesulfonic acid or arylsulfonic acid. In general, the acid is present in an amount to impart conductivity to a bath containing the acidic electrolyte composition. Typically, the pH of the acidic electrolyte of the present invention has a pH of less than 7, and more typically less than 1. It will be appreciated by those skilled in the art that the pH of the acidic electrolyte may be adjusted by any known methods if necessary.

Any suppressor may be advantageously used in the present invention. Suppressors, as used throughout this specification, refer to any compounds that suppress the plating rate of the metal to be plated as compared to baths without such suppressors. Suitable suppressors include polymeric materials, preferably having heteroatom substitution, particularly oxygen linkages. In general, suppressors are typically high molecular weight polyethers, such as, but not limited to, those of the formula

$$R—O—(CXYCX'Y'O)_nH$$

wherein R is an aryl, alkyl or alkenyl group containing from about 2 to 20 carbons; X, Y, X', and Y' are each independently hydrogen, alkyl, such as methyl, ethyl or propyl, aryl, such as phenyl, and aralkyl such as benzyl; and n is an integer between 5 and 100,000. It is preferred that one or more of X, Y, X' and Y' is hydrogen.

Suitable suppressors include, but are not limited to: amines, such as ethoxylated amines; polyoxyalkylene amines and alkanol amines; amides; poly-glycol type wetting agents, such as polyethylene glycols, polyalkylene glycols and polyoxyalkylene glycols; high molecular weight polyethers; polyethylene oxides, such as those having a molecular weight in the range of 1,000 to 100,000; polyoxyalkylene block copolymers, alkylpolyether sulfonates; complexing suppressors such as alkoxylated diamines; and complexing agents for cupric or cuprous ions, such as citric acid, edetic acid, tartaric acid, potassium sodium tartrate, acetonitrile, cupreine and pyridine.

Particularly useful suppressors include, but are not limited to:
ethyleneoxide/propyleneoxide ("EO/PO") block copolymers; ethoxylated polystyrenated phenol having 12 moles of ethyleneoxide ("EO"), ethoxylated butanol having 5 moles of EO,
ethoxylated butanol having 16 moles of EO, ethoxylated butanol having 8 moles of EO,
ethoxylated octanol having 12 moles of EO, ethoxylated beta-naphthol having 13 moles of EO,
ethoxylated bisphenol A having 10 moles of EO, ethoxylated sulfated bisphenol A having 30 moles of EO and ethoxylated bisphenol A having 8 moles of EO.

In general, the suppressor may be added in any amount that provides sufficient lateral growth of the metal seed layer. Typically, the amount of suppressor is in the range of 0.001 to 10, grams per liter, and preferably 0.1 to 2.0 grams per liter.

It will be appreciated by those skilled in the art that one or more other components may be added to the acidic electrolyte compositions of the present invention, such as levelers and other alloying materials. It is important that the acidic electrolyte compositions of the present invention are substantially free of accelerators, that is, compounds that enhance the plating rate of the metal to be plated at a given potential. It is preferred that the acidic electrolyte compositions useful for substantially repairing or filling discontinuities are free of accelerators.

The acidic electrolyte baths of the present invention may be prepared by first adding water to a vessel followed by the one or more copper compounds, the one or more acids, and the one or more suppressors. Other orders of addition of the components may be used.

Discontinuities in a metal seed layer are substantially removed by contacting the metal seed layer disposed on a substrate with an acidic electrolyte bath of the present invention and subjecting the bath to a current density in the range of up to about 0.1 A/cm$^2$. It is preferred that the current density is in the range of about 0.002 to about 0.05 A/cm$^2$, and more preferably in the range of about 0.003 to 0.01 A/cm$^2$. The voltage may be applied to the acidic electrolyte bath by any conventional means, such as through the use of soluble or insoluble anodes, typically soluble anodes, with a direct current or pulse power supply. Typically, the voltage is applied to the acidic electrolyte bath for a period of time in the range of 10 to 300 seconds, preferably 20 to 120 seconds, and more preferably 25 to 60 seconds.

Once the discontinuities in the metal seed layer are repaired, the substrate may be removed from the acidic electrolyte bath, optionally rinsed, such as with deionized water, and then subjected to electrochemical plating of the final metal layer. Such electrochemical plating may be by any known means. In the alternative, once the discontinuities in the metal seed layer are repaired, the substrate may be removed from the bath and then subjected to electroless plating of the final metal layer. Such electroless plating may be by any known means.

The lateral seed layer growth or repair process of the present invention may be used advantageously on metal seed layers containing metal oxide as well as on metal seed layers free of metal oxide. The present invention may be used to laterally enhance the growth of, or repair of, metal seed layers without substantially affecting the thickness of the metal seed layer. It is preferred that the metal seed layer is subjected to both metal oxide removal, that is, cathodic activation, and discontinuity removal according to the present invention.

Thus, the present invention provides a method for providing a metallized layer disposed a substrate comprising the steps of: a) optionally coating the substrate with a barrier layer; b) providing a metal seed layer of the surface of the substrate; c) repairing the metal seed layer by substantially repairing discontinuities in the metal seed layer comprising the step of contacting the metal seed layer with an acidic electrolyte bath and subjecting the bath to a current density in the range of up to about 0.1 A/cm$^2$, wherein the acidic electrolyte bath comprises one or more acids, one or more copper compounds, one or more suppressors and water, and wherein the acidic electrolyte bath is substantially free of accelerators; d) subjecting the repaired metal seed layer to a metal plating bath to provide a metallized layer disposed on the substrate; and e) optionally rinsing the metallized layer disposed on the substrate. It is preferred that such method further include the step of removing metal oxide from the surface of the metal seed layer including the step of contacting the metal seed layer with an aqueous solution having a pH maintained in the range of about 6.5 to about 13 and subjecting the solution to a voltage of from about 0.1 to 5 volts prior to step d). The present invention further provides for substrates having a metallized layer disposed thereon according to the above described method.

Further, the present invention provides a method of providing a metal seed layer substantially free of metal oxide and substantially free of discontinuities disposed on a substrate including the steps of contacting a metal seed layer disposed on a substrate with an aqueous solution having a pH maintained in the range of about 6.5 to about 13, subjecting the aqueous solution to a voltage of from about 0.1 to 5 volts, removing the substrate, optionally rinsing the metal seed layer disposed on the substrate, contacting the metal seed layer with an acidic electrolyte bath and subjecting the acidic electrolyte bath to a current density in the range of up to about 0.1 A/cm$^2$, wherein the acidic electrolyte bath includes one or more acids, one or more copper compounds, one or more suppressors and water, and wherein the acidic electrolyte bath is substantially free of accelerators.

The seed layer repair methods of the present invention are particularly suited to copper seed layers. The methods of the present invention are particularly suited to repairing copper seed layers on microelectronic devices having sub-one micron geometries, more particularly on sub-0.5 micron geometries, and even more particularly on sub-0.3 micron geometries.

It will be appreciated by those skilled in the art that substrates having seed layers repaired by the methods of the present invention may also be further enhanced by annealing the seed layers, particularly copper seed layers. Such annealing is known to affect the microstructure of the copper layer. See, for example, Ueno et al., Seed Layer Dependence of Room-Tenperature Recrystallization in Electroplated Copper Films, *Journal of Applied Physics*, volume 86, number 9, November 1999.

The following examples are intended to illustrate further various aspects of the present invention, but are not intended to limit the scope of the invention in any aspect.

EXAMPLE 1

Silicon wafers obtained from a commercial production process were coated with a copper seed layer. The copper seed layer was blanket deposited using ion metal plasma ("IMP") deposition. On all the wafers, focused ion beam inspection showed that the seed layer on the walls and at the base of the vias was thinner than usual. The diameter of the vias was 0.2 micron. The test wafers were placed in a buffer bath containing 6.16 g/L boric acid, 9.55 g/L sodium borate decahydrate and sufficient deionized water ("DI") to make 1 liter. A potential of two volts was applied to the bath for 30 sec at room temperature. The test wafers were then removed from the buffer bath, rinsed with DI water, dried and then placed in a copper electroplating tool where copper was electroplated under standard conditions. The control wafers, which were not subjected to the cathodic activation treatment, were copper electroplated on the same tool and under the same conditions as the test wafers.

Figure 2:
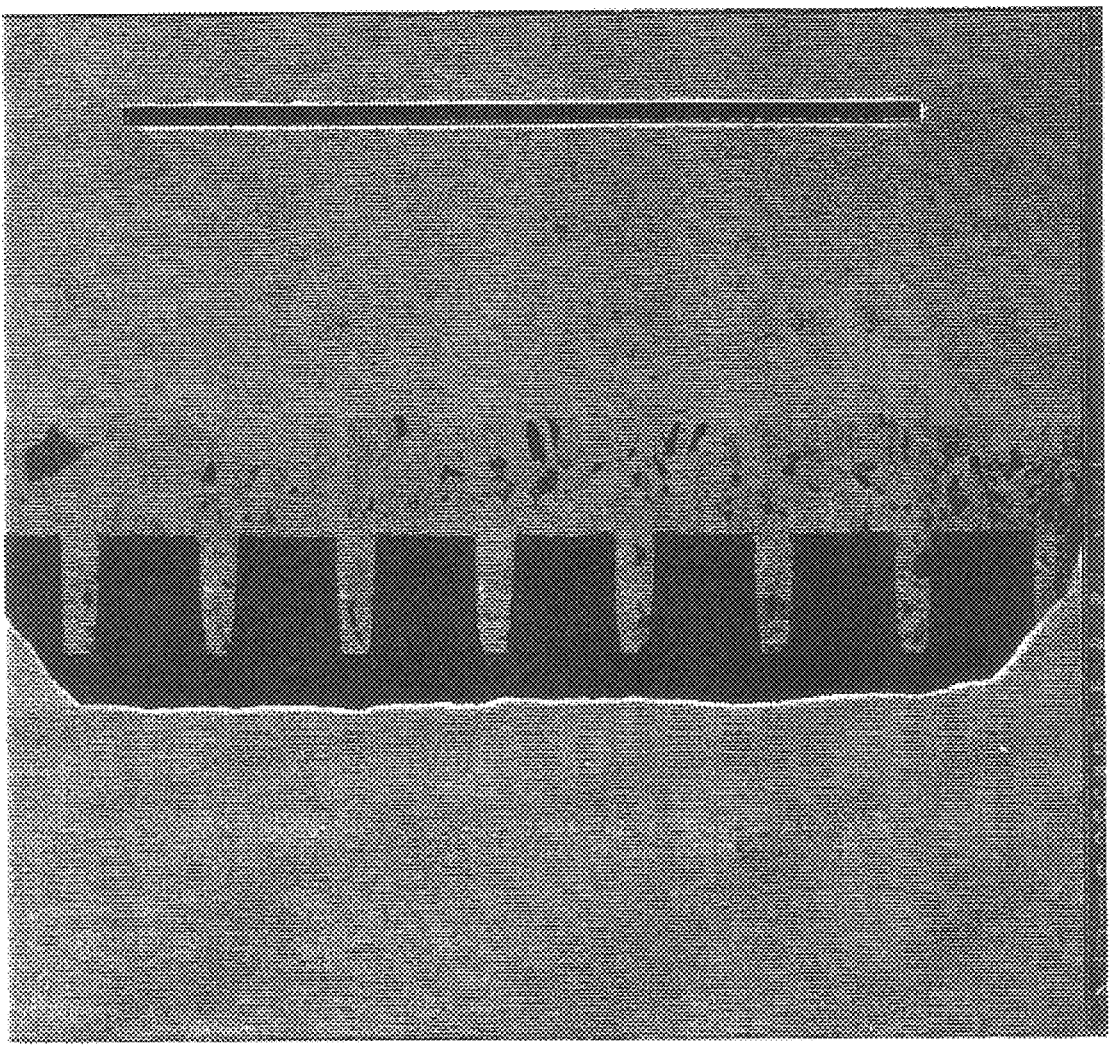
FIG. 2 is a SEM of a wafer showing 0.2 micron vias containing no voids.

The plated wafers were examined by scanning electron microscopy. FIG. 1 shows a SEM of a plated control wafer having 0.2 micron vias. The black spots visible in the bottoms of the vias are voids. FIG. 2 shows a SEM of a plated test wafer having 0.2 micron vias. It can be clearly seen in FIG. 2 that no voids are present. Thus, the cathodic activation process is effective in eliminating the incorporation of defects (voids) in electrodeposited metal films in geometries as small as 0.2 micron.

EXAMPLE 2

Test wafer segments having a very thin (100 Å) seed layer were plated in a 1 L bath. Wafer A (control) was plated with a standard copper plating bath containing 18 g/L copper as copper sulfate pentahydrate, 180 g/L sulfuric acid and 50 ppm hydrochloric acid in 974 mL of water along with 1 mL/L accelerator and 25 mL/L suppressor solution (an EO/PO block copolymer). Wafer B (comparative 1) was plated with a bath containing only 74 g/L of copper (270 g/L copper sulfate pentahydrate) and 4 percent by weight, based on the total weight of the bath, sulfuric acid, the remainder being water. Wafer C (invention) was plated with a bath containing 74 g/L of copper (270 g/L copper sulfate pentahydrate), 4 percent by weight sulfuric acid, and 25 mL/L of a suppressor solution containing (EO/PO block copolymer in water). Wafer D (comparative 2) was plated with a bath containing 74 g/L of copper (270 g/L copper sulfate pentahydrate), 4 percent by weight sulfuric acid, 25 mL/L of a suppressor solution containing (an EO/PO block copolymer) and 1 mL/L of an accelerator solution containing sulfonic acid disulfide. In each case, the EO/PO block copolymer was the same.

Each wafer segment was plated with a current density in the range of 0.015 to 0.020 A/cm$^2$ for 30 to 40 seconds. The sheet resistance of each wafer segment was measured by a four-point probe as a function of distance from an electrical contact (clamp) within each wafer. These results are reported in the Table. The sheet resistance is reported in micro-ohms per square. The thickness of the copper layer is inversely proportional to the sheet resistance.

| | Sheet Resistance of Wafers | | | |
|---|---|---|---|---|
| Distance (cm) | Wafer A (Control) | Wafer B (Comparative 1) | Wafer C (Invention) | Wafer D (Comparative 2) |
| 1 | 122.4 | 774.6 | 263.7 | 303.5 |
| 2 | 190.3 | 928.6 | 299.0 | 362.4 |
| 3 | 312.7 | 747.5 | 344.3 | 471.0 |
| 4 | 507.4 | — | 340.0 | 607.0 |
| 5 | 634.2 | 1042 | 321.6 | 684.0 |

These data clearly show that the Control bath (wafer A) yielded a copper deposit with a thickness that is gradually reduced with the distance from the electrical contact. It can also be seen from the data that without the use of suppressor (wafer B) that the thickness of the copper deposit also gradually decreased with the distance from the electrical contact. Wafer C clearly shows that the addition of suppressor to a high copper concentration in the plating bath provides a wafer having a copper deposit of relatively high thickness which is relatively constant across the wafer. Wafer D clearly shows that the addition of a small amount of accelerator to the plating bath of wafer C provides a copper deposit with a thickness that is gradually reduced with the distance from the electrical contact.

What is claimed is:

1. A method of providing a metallized layer disposed on a substrate comprising the steps of contacting a metal seed layer having discontinuities disposed on the substrate with an acidic electrolyte bath and subjecting the bath to a current density in the range of up to about 0.1 A/cm$^2$, wherein the acidic electrolyte bath comprises one or more acids, one or more copper compounds, one or more suppressors and water, and wherein the acidic electrolyte bath is free of accelerators, to provide a repaired metal seed layer substantially free of discontinuities; and then subjecting the repaired metal seed layer to a metal plating bath to provide a metallized layer on the repaired metal seed layer.

2. The method of claim 1 wherein the one or more acids are selected from the group consisting of sulfuric acid, acetic acid, fluoroboric acid, nitric acid, alkanesulfonic acid, arylsulfonic acid and sulfamic acid.

3. The method of claim 1 wherein the one or more copper compounds are selected from the group consisting of copper sulfate, copper persulfate, copper halide, copper chlorate, copper perchlorate, copper alkane sulfonate, copper alkanol sulfonate, copper fluoroborate, cupric nitrate and copper acetate.

4. The method of claim 1 wherein the one or more copper compounds are present in the range of 5 to 75 g/L of copper metal.

5. The method of claim 1 wherein the one or more suppressors are selected from the group consisting of amines; polyoxyalkylene amines and alkanol amines; amides; polyglycol type wetting agents; high molecular weight polyethers; polyethylene oxides; polyoxyalkylene block copolymers; alkylpolyether sulfonates; alkoxylated diamines; and complexing agents for cupric or cuprous ions.

6. The method of claim 5 wherein the one or more suppressors are selected from the group consisting of EO/PO block copolymers; ethoxylated polystyrenate phenol having 12 moles of EO, ethoxylated butanol having 5 moles of EO, ethoxylated butanol having 16 moles of EO, ethoxylated butanol having 8 moles of EO, ethoxylated octanol having 12 moles of EO, ethoxylated beta-naphthol having 13 moles of EO, ethoxylated bisphenol A having 10 moles of EO, ethoxylated sulfated bisphenol A having 30 moles of EO and ethoxylated bisphenol A having 8 moles of EO.

7. The method of claim 1 wherein the one or more suppressors is present in an amount in the range of 0.001 to 10 g/L.

8. The method of claim 1 wherein the substrate has sub-one micron geometries.

9. The method of claim 1 wherein the metal seed layer has a thickness of up to 1500 angstroms.

10. A method of providing a metal seed layer substantially free of metal oxide and substantially free of discontinuities disposed on a substrate comprising the steps of contacting a metal seed layer disposed on a substrate with an aqueous solution having a pH maintained in the range of about 6.5 to about 13, subjecting the aqueous solution to a voltage of from about 0.1 to 5 volts, removing the substrate, optionally rinsing the metal seed layer disposed on the substrate, contacting the metal seed layer with an acidic electrolyte bath and subjecting the acidic electrolyte bath to a current density in the range of up to about 0.1 A/cm$^2$, wherein the acidic electrolyte bath includes one or more acids, one or more copper compounds, one or more suppressors and water, wherein the acidic electrolyte bath is free of accelerators.

11. The method of claim 10 wherein the seed layer comprises copper or copper alloys.

12. A method for providing a metallized layer disposed on a substrate comprising the steps of:

a) optionally coating the substrate with a barrier layer;

b) providing a metal seed layer on the surface of the substrate, the metal seed layer having discontinuities;

c) repairing the metal seed layer by substantially repairing the discontinuities in the metal seed layer comprising the step of contacting the metal seed layer with an acidic electrolyte bath and subjecting the bath to a current density in the range of up to about 0.1 A/cm$^2$, wherein the acidic electrolyte bath comprises one or more acids, one or more copper compounds, one or more suppressors and water, and wherein the acidic electrolyte bath is substantially free of accelerators;

d) subjecting the repaired metal seed layer to a metal plating bath to provide a metallized layer disposed on the repaired metal seed layer; and e) optionally rinsing the metallized layer disposed on the repaired metal seed layer.

13. The method of claim 12 further comprising the step of removing metal oxide from the surface of the metal seed layer comprising the step of contacting the metal seed layer with an aqueous solution having a pH maintained in the range of about 6.5 to about 13 and subjecting the solution to a voltage of from about 0.1 to 5 volts prior to step d).

14. The method of claim 12 wherein the substrate has sub-one micron geometries.

15. The method of claim 12 wherein the metal seed layer comprises copper or copper alloys.

16. The method of claim 12 wherein the metal plating bath is an electroplating bath.

17. A method of providing a metallized layer disposed on a substrate comprising the steps of contacting a metal seed layer having discontinuities disposed on the substrate with an acidic electrolyte bath and subjecting the bath to a current density of up to about 0.1 A/cm$^2$, wherein the acidic electrolyte bath consists essentially of one or more acids, one or more copper compounds, one or more suppressors, water, and optionally one or more levelers, to provide a repaired metal seed layer substantially free of discontinuities; and then subjecting the repaired metal seed layer to a metal plating bath to provide a metallized layer on the repaired metal seed layer.

18. The method of claim 17 wherein the metal seed layer comprises copper or copper alloys.

19. The method of claim 17 wherein the substrate comprises sub-one micron geometries.

20. A method for providing a metallized layer disposed on a substrate comprising the steps of:

a) optionally coating the substrate with a barrier layer;

b) providing a metal seed layer on the surface of the substrate, the metal seed layer having discontinuities;

c) repairing the metal seed layer by substantially repairing the discontinuities in the metal seed layer comprising the step of contacting the metal seed layer with an acidic electrolyte bath and subjecting the bath to a current density of up to about 0.1 A/cm$^2$, wherein the acidic electrolyte bath consists essentially of one or more acids, one or more copper compounds, one or more suppressors, water, and optionally one or more levelers;

d) subjecting the repaired metal seed layer to a metal plating bath to provide a metallized layer disposed on the repaired metal seed layer; and e) optionally rinsing the metallized layer disposed on the repaired metal seed layer.

* * * * *